United States Patent
Rink et al.

(10) Patent No.: US 10,241,153 B2
(45) Date of Patent: Mar. 26, 2019

(54) DEVICE FOR MEASURING AN ELECTRIC CURRENT

(75) Inventors: Klaus Rink, Rodenbach (DE); Wolfgang Jöckel, Gersfeld (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 395 days.

(21) Appl. No.: 14/232,417

(22) PCT Filed: Jul. 13, 2012

(86) PCT No.: PCT/EP2012/063856
§ 371 (c)(1),
(2), (4) Date: Mar. 6, 2014

(87) PCT Pub. No.: WO2013/007833
PCT Pub. Date: Jan. 17, 2013

(65) Prior Publication Data
US 2014/0210479 A1    Jul. 31, 2014

(30) Foreign Application Priority Data
Jul. 14, 2011 (DE) .................. 10 2011 079 176

(51) Int. Cl.
*G01R 1/20* (2006.01)
*G01R 15/20* (2006.01)
(Continued)

(52) U.S. Cl.
CPC ......... *G01R 31/3613* (2013.01); *G01R 1/203* (2013.01); *G01R 19/0092* (2013.01);
(Continued)

(58) Field of Classification Search
CPC ................. G01R 31/3696; G01R 31/3613
(Continued)

(56) References Cited

U.S. PATENT DOCUMENTS

| | | | |
|---|---|---|---|
| 4,743,875 A | 5/1988 | Murphy | |
| 6,304,054 B1 * | 10/2001 | Granberg | H02J 7/1423 307/10.1 |

(Continued)

FOREIGN PATENT DOCUMENTS

| | | |
|---|---|---|
| DE | 195 26 870 C1 | 8/1996 |
| DE | 102 40 243 A1 | 3/2004 |

(Continued)

OTHER PUBLICATIONS

What is a shunt in electrical terms? <https://www.google.com/search?q=de3finition+shunt&rlz=1C1GCEB_enUS792US792&oq=de3finition+shunt&aqs=32 chrome..69i57j015.3750j0j8&sourceid=chrome&ie=UTF-8>.*

(Continued)

*Primary Examiner* — Drew A Dunn
*Assistant Examiner* — Harry O'Neill-Becerril
(74) *Attorney, Agent, or Firm* — RatnerPrestia

(57) ABSTRACT

The invention relates to a device for measuring an electric current between a vehicle battery and an electrical consumer connected to the vehicle battery. The claimed device includes a bus bar which picks up the electric current in the vehicle battery and guides it further to the electrical consumer, on which a first current sensor and a second current sensor which is different from the first current sensor are arranged, the current sensors being designed to measure, independently from each other, the electric current circulating in the bus bar.

9 Claims, 4 Drawing Sheets

(51) Int. Cl.
 G01R 19/00 (2006.01)
 G01R 31/36 (2006.01)
(52) U.S. Cl.
 CPC .......... G01R 31/361 (2013.01); *G01R 15/205* (2013.01); *H01L 2224/48091* (2013.01); *H01L 2224/49111* (2013.01); *H01L 2224/49175* (2013.01)
(58) Field of Classification Search
 USPC .......................... 324/426, 76.11, 76.75, 126
 See application file for complete search history.

(56) References Cited

U.S. PATENT DOCUMENTS

| | | | | |
|---|---|---|---|---|
| 2007/0200551 A1* | 8/2007 | Muraki | ................ | G01R 15/207 324/127 |
| 2008/0030208 A1* | 2/2008 | Aratani | .................. | G01R 1/203 324/713 |
| 2012/0086430 A1* | 4/2012 | Marten | ............. | G01R 19/0092 324/76.11 |

FOREIGN PATENT DOCUMENTS

| | | | |
|---|---|---|---|
| DE | 10 2004 007 851 A1 | 9/2005 | |
| DE | 10 2004 055 848 A1 | 5/2006 | |
| DE | 10 2006 006 328 A1 | 8/2006 | |
| DE | 10 2009 046 564 A1 | 5/2011 | |
| DE | 10 2011 078 548 A1 | 1/2012 | |
| EP | 1 213 189 A1 | 6/2002 | |
| EP | 1213189 A1 * | 6/2002 | ........... G01R 31/361 |
| EP | 2 068 402 A1 | 6/2009 | |

OTHER PUBLICATIONS

International Search Report for PCT/EP2012/063856 dated Oct. 23, 2012.
International Written Opinion for PCT/EP2012/063856 dated Oct. 23, 2012.
German Search Report for 10 2012 212 367.9 dated Feb. 4, 2013.

* cited by examiner

DEVICE FOR MEASURING AN ELECTRIC CURRENT

CROSS REFERENCE TO RELATED APPLICATIONS

This application is the U.S. National Phase Application of PCT/EP2012/063856, filed Jul. 13, 2012, which claims priority to German Patent Application No. 10 2011 079 176.0, filed Jul. 14, 2011, the contents of such applications being incorporated by reference herein.

FIELD OF THE INVENTION

The invention relates to a device for measuring an electric current between a vehicle battery and an electrical consumer connected to the vehicle battery, to a vehicle having the device, to a method for measuring an electric current between a vehicle battery and an electrical consumer connected to the vehicle battery and to a device for performing the method.

BACKGROUND OF THE INVENTION

In order to conduct measurements of an electric current, which is output from an electrical energy source to an electrical consumer, in a motor vehicle, a current sensor can be connected in series between the electrical energy source and the electrical consumer. A current sensor of this type is known from DE 10 2011 078 548 A1, which is incorporated by reference, for example.

The problem addressed by the present invention is to improve the current measurements.

SUMMARY OF THE INVENTION

The problem is solved by means of the features of the independent claims. Preferred developments are the subject matter of the dependent claims.

An aspect of the invention proposes a device for measuring an electric current between a vehicle battery and an electrical consumer connected to the vehicle battery, wherein the current is measured via two redundant current sensors.

An aspect of the invention is based on the idea that it is important in electric and hybrid vehicles to have information which is as precise as possible about the energy still available until the next charge, that is to say about the state of charge, firstly, in order not to break down while driving and, secondly, in order to optimize, using appropriate energy management, a limited range which can be traveled using the energy already available.

Admittedly, depending on the type of vehicle battery used in a vehicle, it was already possible to determine the state of charge thereof by means of a voltage measurement. Alternatively, the state of charge could, however, also be determined via a charge calculation during charging and discharging of the vehicle battery. This calculation is based on the calculation of the amount of charge on the basis of the equation $Q=I*t$, for which a precise current measurement would be necessary, however.

Taking this idea as a basis, an aspect of the invention is based on the concept that, owing to the necessary integration with respect to time when calculating the amount of charge, errors in the current detection increase and can lead to completely false states of charge of the battery. Therefore, the invention proposes not to perform the current detection with a single current sensor but with two different current sensors.

An aspect of the invention therefore specifies a device for measuring an electric current between a vehicle battery and an electrical consumer connected to the vehicle battery, said device comprising a busbar, which receives the electric current from the vehicle battery and transfers it to the electrical consumer and on which a first current sensor and a second current sensor, which is different from the first current sensors are arranged, said current sensors being configured to measure the electric current through the busbar independently of one another.

In this way, the current to be measured is detected redundantly, which reduces the error rate associated with measuring the current and thus leads to a considerably more precise detection of the state of charge of the vehicle battery.

Since the current measurement is also used to determine the so-called state of health and the so-called state of function, a wide variety of other system functions of a vehicle battery management system can also be improved using the specified device, for instance:

disconnecting or reducing the consumption of electrical consumers until the vehicle is immobilized before or when a minimum charge in the drive battery is reached, disconnecting or reducing the consumption of the charging process when a maximum charge is reached, for example during recuperation when a vehicle battery is already completely charged, limiting the load current by means of open-loop control of a discharge current of the vehicle battery in order to avoid permanent damage to the battery cells, monitoring the charge current in order to prevent damage to the cells owing to too large a charge current, breaking the current path between the vehicle battery and the electrical consumer or, respectively, the electrical energy source if a defined overcurrent level is detected for a determined minimum amount of time, and detecting leakage currents in the parked vehicle when the vehicle ignition is switched off.

In a development of the specified device, the first current sensor has a measuring principle which is independent of the second current sensor. In this way, the reliability of the redundantly designed current sensors can be increased further, since the different measuring principles are differently susceptible to different external influences, such as fluctuations in temperature or pressure.

In another development of the specified device, the busbar comprises a conductor loop, in which the first current sensor detects the current to be measured on the basis of a magnetic measuring principle. In this way, a first one of the measuring principles can be easily implemented.

In an additional development of the specified device, the conductor loop has an electrical interruption which is bridged by the second current sensor, wherein the second current sensor is designed as a shunt. In this way, the two current sensors, which each have different measuring principles, can be placed on a common busbar with a high packing density since the interruption in the busbar is closed by means of the shunt and thus has no effects on the measurement with the magnetic sensor. The resulting device can in this way be exchangeably connected with the smallest dimensions and in one piece between the vehicle battery and the consumer, with the result that if the measurement results of the two current sensors differ from one another, for example when detecting an erroneous current measurement, the device can be promptly replaced.

In a particular development of the specified device, a voltage drop, caused by the electric current to be measured, across the shunt can be kept constant by a control voltage, with the result that the control voltage is dependent on the electric current to be measured. The corresponding active shunt should expediently be designed such that the resolution of the measured value could be found as a function of the current to be measured on the basis of a non-linear characteristic curve and thus a measurement via a high dynamic range using standard components for signal conditioning is made possible. For this purpose, the active shunt could have, for example, an inversely proportional characteristic curve, as a result of which the resolution of the measured value of the current to be measured is coarser with larger currents. By way of example, a field-effect transistor could be selected as the active shunt.

In another development of the specified device, the electrical interruption divides the conductor loop into two conductor-loop limbs which are electrically isolated from one another, wherein the two conductor-loop limbs in the specified device are stacked. In this way, the packing density can be increased further, since, in this way, the conductor loop can extend not only horizontally but also vertically.

In a particularly preferred development of the specified device, the stacked conductor-loop limbs are connected to one another via an electrically isolating mechanical connection, which is different from a connection via the shunt. In this way, a particularly large mechanical hold is achieved between the two conductor-loop limbs, which hold does not have to be provided by the electrical connection via the shunt, with the result that the electrical connection is more resistant and thus less susceptible to faults.

An aspect of the invention also specifies a vehicle battery, which comprises an electrical connection for outputting an electric current to an electrical consumer or, respectively, for receiving an electric current from an electrical energy source, and a specified device, which is connected to the electrical connection.

An aspect of the invention also specifies a vehicle, which comprises a vehicle battery, an electrical consumer and one of the specified devices, which is connected between the electrical consumer and the vehicle battery.

The invention also specifies a method for detecting a measured value for an electric current between a vehicle battery and an electrical consumer connected to the vehicle battery, said method comprising the following steps:
- detecting a first value for the electric current using a first current sensor,
- detecting a value for the electric current using a second current sensor, which is different from the first current sensor, and
- determining the measured value for the electric current on the basis of the first and second value.

The specified method can be extended in any desired manner such that it can be correspondingly performed using a device according to the subclaims.

The invention also specifies a control device which is designed to perform a method as claimed in one of the preceding claims.

In a development of the invention, the specified device has a memory and a processor. In this case, the specified method is stored in the memory in the form of a computer program and the processor is provided for performing the method if the computer program is loaded into the processor from the memory.

BRIEF DESCRIPTION OF THE FIGURES

The above-described properties, features and advantages of this invention and the way in which these are achieved become clearer and simpler in connection with the following description of the exemplary embodiments, which are explained in more detail with reference to the drawings, in which.

DETAILED DESCRIPTION OF THE INVENTION

In the figures, identical technical elements are provided with identical reference signs and are only described once.

Figure 1:
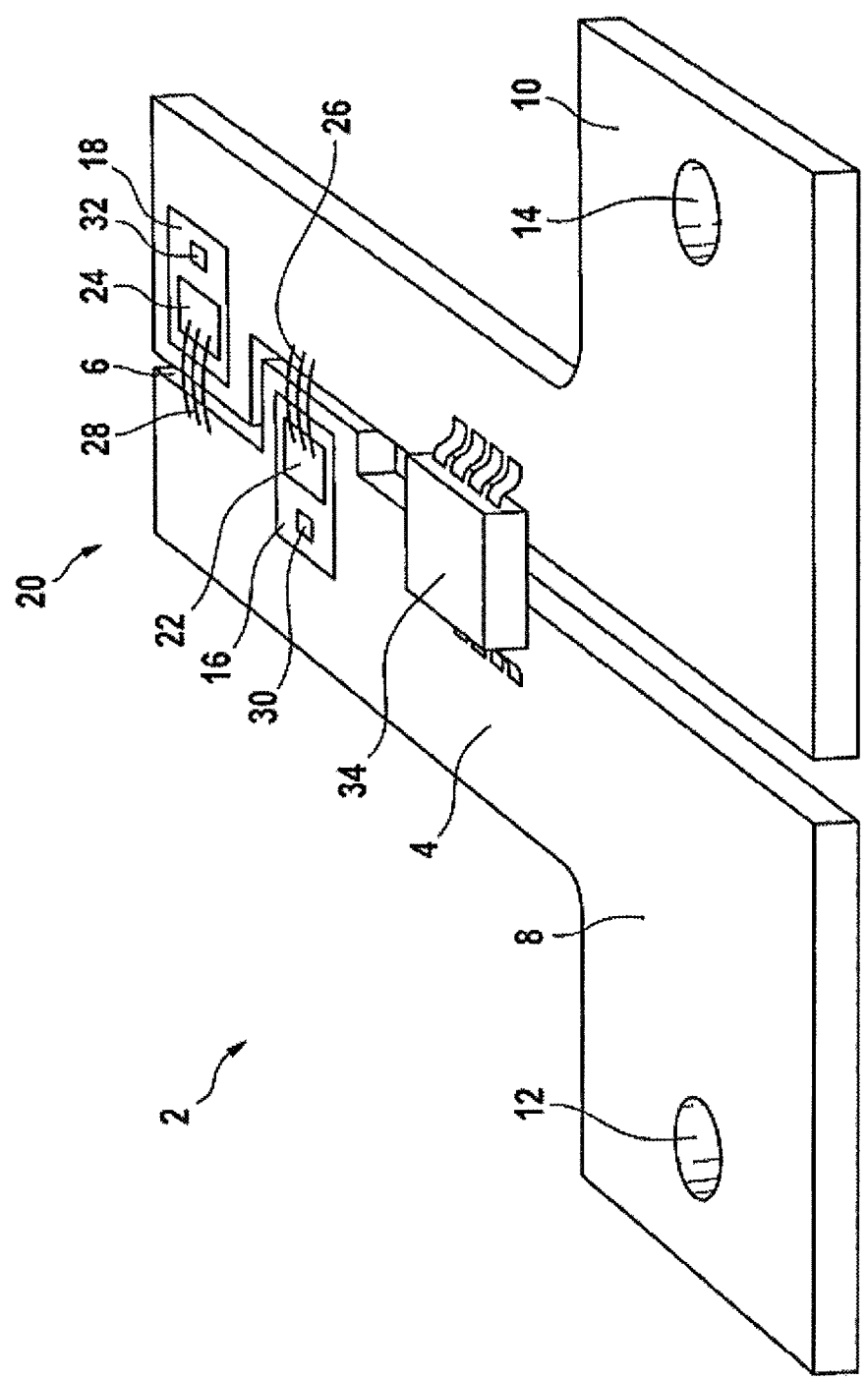
FIG. 1 shows a schematic view of a first exemplary embodiment of the specified device.

Reference is made to FIG. 1, which shows a schematic view of a first exemplary embodiment of the specified device 2.

In the present embodiment, the device 2 has a busbar 4, which has an electrical interruption 6, which divides the busbar 4 into two busbar parts 8, 10. In the present embodiment, each busbar part 8, 10 is bent at a right angle, with the result that the busbar 4 forms a substantially U-shaped conductor loop when the two busbar parts are brought together. Each of the busbar parts 8, 10 can be fastened to a vehicle battery—not shown in more detail—or a connection cable—not shown in more detail—via a respective through-hole 12, 14 which connects an electrical consumer or an electric generator in the vehicle to the busbar 4. Hence, the busbar 4 is connected in series between the connection cable and the vehicle battery.

A power field-effect transistor 16, 18, known from DE 10 2011 078 548 A1 and called FET 16, 18 in the following text, is borne in each case on the first and the second busbar parts 8, 10, said FET being part of an active shunt 20, which is disclosed in the aforesaid document. In the present embodiment, the busbar parts 8, 10, on which the FETs 16, 18 are borne, in each case make electrical contact with a source connection—not visible in more detail in the present illustration—of the first FET 16 and a drain connection—not visible in more detail in the present illustration—of the second FET 18. A drain connection 22 of the first FET 16 and a source connection 24 of the second FET 18 are in each case connected to bond wires 26, 28. The free source or drain connection 22, 24 of a FET 16, 18 is in each case electrically connected to that busbar part 8, 10 on which the corresponding FET 16, 18 is not borne, by means of the electrical bond wires 26, 28. In this way, the FETs 16, 18, together with the bond wires 26, 28, bridge the two busbar parts 8, 10 and thus produce a closed current path across the busbar 4.

As explained in more detail in DE 10 2011 078 548 A1, the two FETs 16, 18 are interconnected between the two busbar parts 8, 10 in order to measure a current flowing through the busbar 4 in two different current directions. For this purpose, an evaluation circuit—not illustrated in more detail—are connected to the gate connections 30, 32 of the FETs 16, 18, it being possible for the construction of said evaluation circuit to be based on the construction disclosed in DE 10 2011 078 548 A1.

The active shunt 20 interconnected between the two busbar parts 8, 10 is intended to constitute by way of example a current sensor in the present embodiment, which current sensor could be used, for example, to measure a charging and discharging current to or from a vehicle battery. Alternatively, a passive shunt can also be connected between the two busbar parts 8, 10.

In the present embodiment, the active shunt 20 bridges the electrical interruption 6 between the busbar parts 8, 10 at one of the ends of the busbar parts 8, 10. As seen from the active shunt 20, the electrical interruption 6 between the busbar parts 8, 10 is additionally bridged below the active shunt by a magnetic field-based current sensor 34. The magnetic field-based current sensor 34 can be, for example, a magnetoresistive sensor, which can detect a magnetic resistance of the busbar 4 in a manner known to a person skilled in the art, wherein the detected magnetic resistance is dependent on the electric current which passes through the conductor loop and hence the busbar 4. Alternatively, the magnetic field-based current sensor 34 can also be a Hall sensor. Therefore, the electric current through the busbar 4 can be detected in a redundant manner using the magnetic field-based current sensor 34.

From the point of view of the magnetic field-based current sensor 34, in the present embodiment, an electrical interruption 6 is inserted into the conductor loop, which is required anyway, for magnetic field-based detection of the electric current flowing through the busbar 4, which electrical interruption is electrically bridged by the shunt embodied as active shunt 20 and is used for redundant measurement of the electric current flowing through the busbar 4.

In the present embodiment, the two busbar parts 8, 10 engage in one another in a toothed manner at the electrical interruption 6, with the result that further FETs for measuring the electric current through the busbar 4 could be arranged at this location, in addition to the FETs 16, 18 which are shown.

Figure 2:
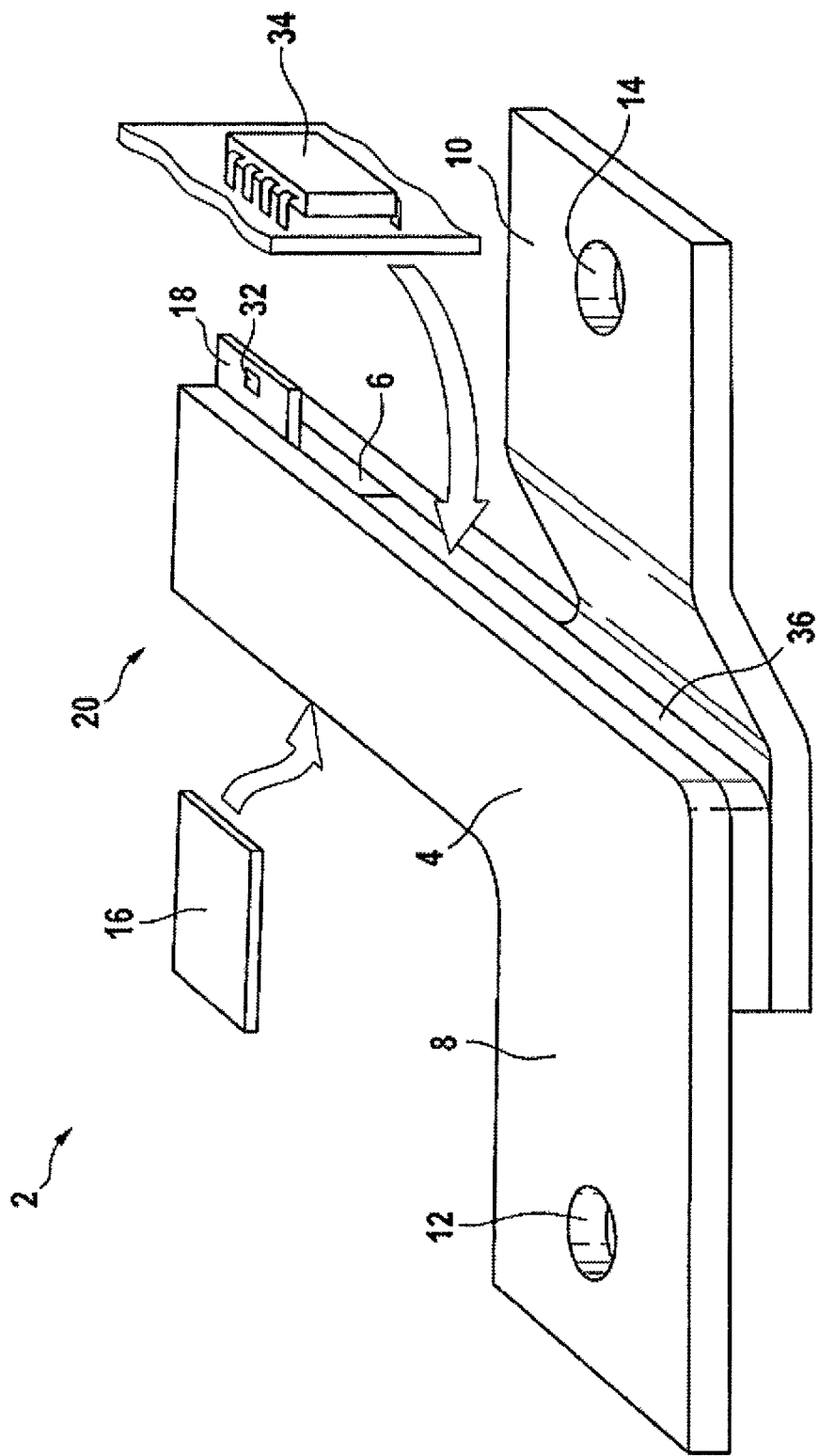
FIG. 2 shows a schematic view of a second exemplary embodiment of the specified device.

Reference is made to FIG. 2, which shows a schematic view of a second exemplary embodiment of the device 2.

In FIG. 2, the busbar 4 is formed from the busbar parts 8, 10 by stacking said busbar parts 8, 10 instead of laying them next to one another. In this way, the busbar parts 8, 10 offer a sufficient surface area to accommodate a mechanical connection means 36, for instance an adhesive, in the electrical interruption 6, which adhesive holds the two busbar parts 8, 10 together mechanically.

Not only does this have the advantage that the busbar 4 possesses a better mechanical hold, but also direct contact can now be made with the source connection or, respectively, the drain connection of the two FETs 16, 18 on the upper and lower sides thereof, with the result that the bond wires 26, 28 are obsolete. With the omission of the bond wires 26, 28, electrical contact-making points for making contact with said bond wires 26, 28 are also omitted, as a result of which the electrical resistance of the busbar 4 in the present embodiment is particularly low.

In the present embodiment, the first FET 16 is inserted with a particular orientation between the two busbar parts 8, 10, while the second FET 18 is inserted with precisely the opposite orientation between the two busbar parts 8, 10 in order to permit the abovementioned detection of the current through the busbar 4 in both directions. Finally, only the gate connections 30, 32, via which the evaluation circuit—mentioned above and not illustrated in any more detail—can make electrical contact with the FETs 16, 18, still project from the FETs 16, 18 out of the stack of busbar parts 8, 10.

In the present embodiment, the magnetic field-based sensor 34 makes contact with the two busbar parts 8, 10 from the side at the busbar 4.

Figure 3:
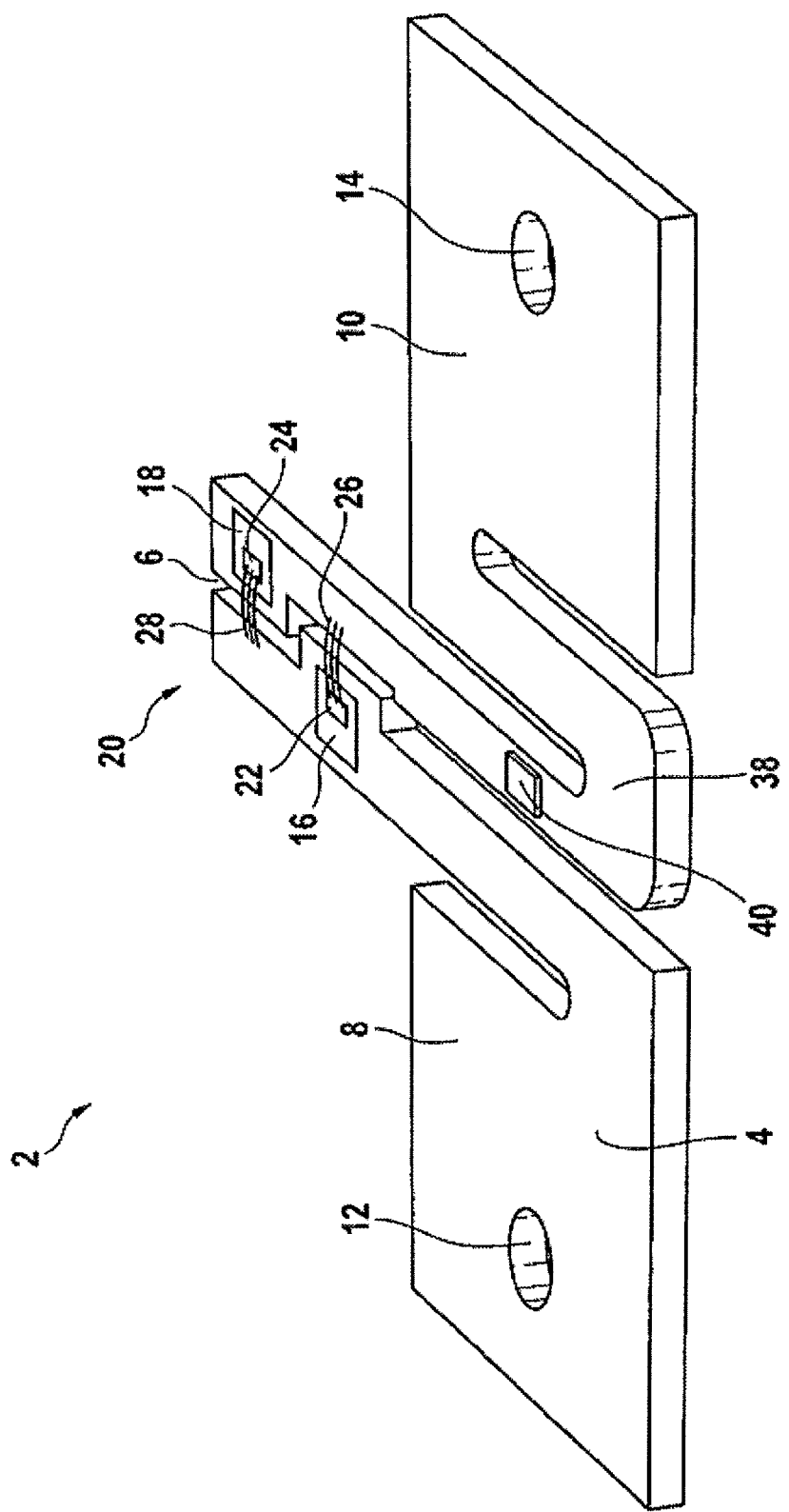
FIG. 3 shows a schematic view of a third exemplary embodiment of the specified device.

Reference is made to FIG. 3, which shows a third embodiment of the device 2.

In the present embodiment, the second busbar part 10 has an additional winding 38 compared to the first busbar part 8 of the device 2. In the present embodiment, a Hall sensor 40 makes electrical contact with this winding 38 and is measured in a manner known to the person skilled in the art a magnetic field generated by the busbar 4, which in a manner known to the person skilled in the art is dependent on the electric current flowing through the busbar 4, with the result that the Hall sensor 40 can detect the current through the busbar 4. In the present embodiment, the busbar 4 therefore also has a conductor loop, which comprises a plurality of windings here, wherein the conductor loop has an electrical interruption at a point which is electrically bridged by a shunt, in this case an active shunt 20.

Figure 4:
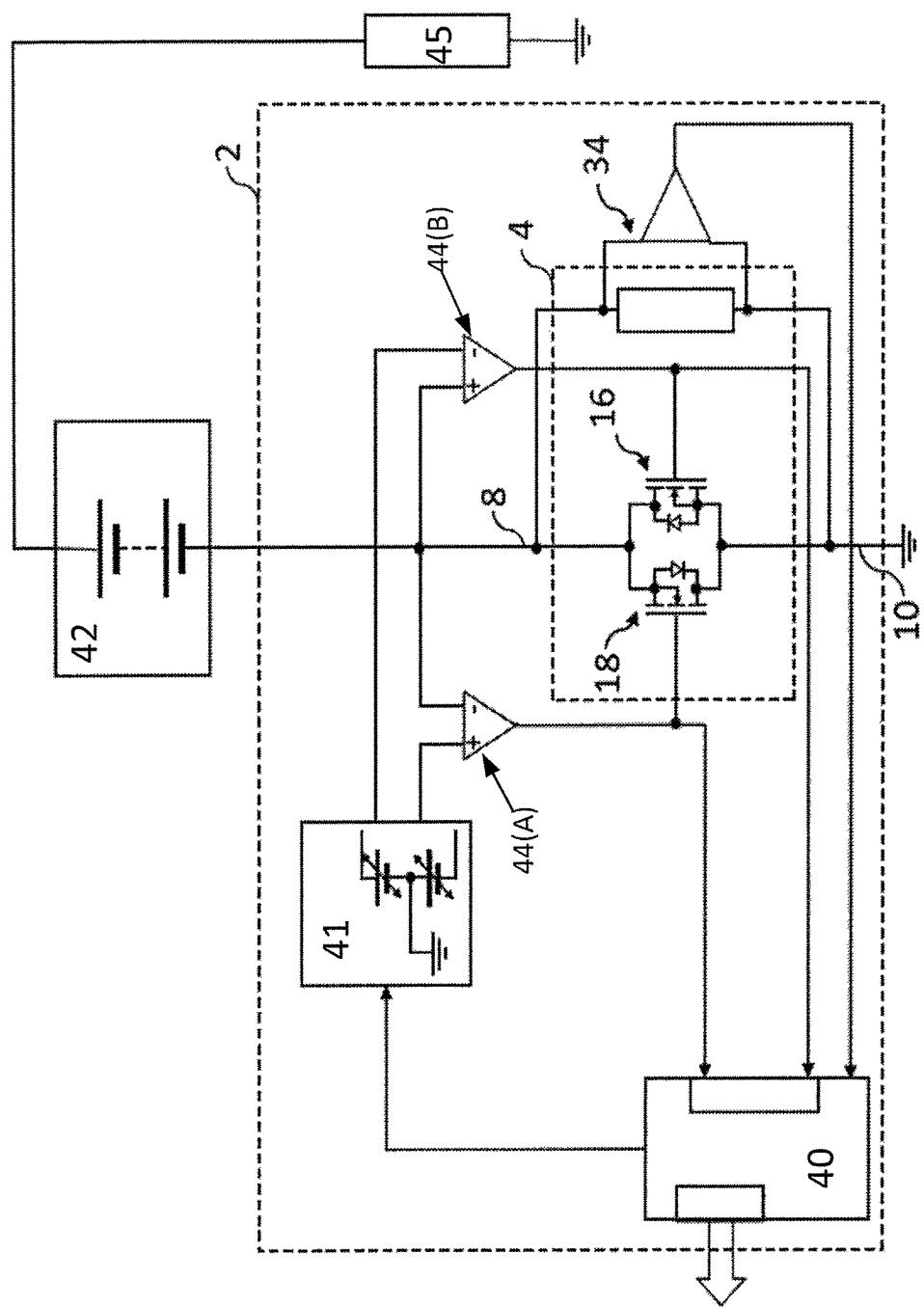
FIG. 4 shows an electrical schematic of an aspect of the invention.

According to an aspect of the present invention, FIG. 4 is an electrical schematic illustrating the interconnection of the various elements of device 2 shown in FIGS. 1 and 2 including busbar 4, busbar parts 8 and 10, transistors 16 and 18, current sensor 34 with other devices supported in in DE 102011078548. These other devices include signal processing unit 40, reference voltage source 41, vehicle battery 42, left and right amplifiers 44(A) and 44(B), and electrical load 45.

In this way, only the space which would be necessary anyway for detecting the current on the basis of a magnetic field is necessary for measuring the current through the busbar 4, wherein the redundant implementation of the additional current sensor in the form of a shunt takes place in an almost space-neutral manner.

The invention claimed is:

1. A device for measuring an electric current between a vehicle battery and an electrical consumer connected to the vehicle battery, said device comprising:
    a busbar, which receives the electric current from the vehicle battery and transfers it to the electrical consumer, the busbar comprising a first busbar part and a second busbar part;
    a first current device arranged on the busbar;
    a second current device arranged on the busbar, the second current device is a first transistor which electrically connects the first busbar part with the second busbar part; and
    a third current device arranged on the busbar, the third current device is a second transistor which electrically connects the second busbar part with the first busbar part,
    wherein the first, second and the third current devices are configured to measure the electric current through the busbar independently of one another,
    wherein a voltage drop across the second current device and the third current device caused by the electric current, is kept constant by a control voltage that is dependent on the electric current.

2. The device as claimed in claim 1, wherein the first current device is operated using a measuring principle which is independent of the second current device.

3. The device as claimed in claim 1, wherein the busbar comprises a conductor loop, in which the first current device detects the current to be measured on the basis of a magnetic measuring principle.

4. The device as claimed in claim 3, wherein the conductor loop has an electrical interruption which is bridged by the second current device.

5. The device as claimed in claim 4, wherein the electrical interruption divides the conductor loop into two conductor-loop limbs which are electrically isolated from one another and are stacked.

6. The device as claimed in claim 5, wherein the stacked conductor-loop limbs are connected to one another via an electrically isolating mechanical connection.

7. A vehicle battery comprising:
   an electrical connection for outputting an electric current to an electrical consumer or, respectively, for receiving an electric current from an electrical energy source, and
   a device for measuring an electric current between a vehicle battery and an electrical consumer connected to the vehicle battery, said device comprising:
      a busbar including a first busbar part and a second busbar part, the busbar receives the electric current from the vehicle battery and transfers it to the electrical consumer and on which a first current device, a second current device and a third current device are arranged,
      wherein the second current device is a first transistor which electrically connects the first busbar part with the second busbar part, and is configured to measure the electric current in only a first direction,
      wherein the third current device is a second transistor which electrically connects the second busbar part with the first busbar part, and is configured to measure the electric current in only a second direction that is opposite the first direction,
      wherein the first, second and the third current devices are configured to measure the electric current through the busbar independently of one another, and
      wherein a voltage drop across the second current device and the third current device caused by the electric current, is kept constant by a control voltage that is dependent on the electric current.

8. A method for detecting a measured value for an electric current between a vehicle battery and an electrical consumer connected to the vehicle battery through a busbar having a first busbar part and a second busbar part, said method comprising:
   detecting a first value for the electric current using a first current device;
   detecting a second value and a third value for the electric current using a second current device and a third current device respectively,
   wherein the second current device is a first transistor which electrically connects the first busbar part with the second busbar part, and is configured to measure the electric current in only a first direction,
   wherein the third current device is a second transistor which electrically connects the second busbar part with the first busbar part, and is configured to measure the electric current in only a second direction that is opposite the first direction,
   wherein the first, second and the third current devices are configured to measure the electric current through the busbar independently of one another, and
   wherein a voltage drop across the second current device and the third current device caused by the electric current, is kept constant by a control voltage that is dependent on the electric current; and
   determining the measured value for the electric current on the basis of the first, second and third value.

9. A control device, which is designed to perform a method for detecting a measured value for an electric current between a vehicle battery and an electrical consumer connected to the vehicle battery through a busbar having a first busbar part and a second busbar part, said method comprising:
   detecting a first value for the electric current using a first current device;
   detecting a second value and a third value for the electric current using a second current device and a third current device respectively,
   wherein the second current device is a first transistor which electrically connects the first busbar part with the second busbar part, and is configured to measure the electric current in only a first direction,
   wherein the third current device is a second transistor which electrically connects the second busbar part with the first busbar part, and is configured to measure the electric current in only a second direction that is opposite the first direction,
   wherein the first, second and the third current devices are configured to measure the electric current through the busbar independently of one another, and
   wherein a voltage drop across the second current device and the third current device caused by the electric current, is kept constant by a control voltage that is dependent on the electric current; and
   determining the measured value for the electric current on the basis of the first, second and third value.

* * * * *